United States Patent [19]
Lowrey et al.

[11] Patent Number: 5,891,744
[45] Date of Patent: Apr. 6, 1999

[54] METHOD OF MONITORING A PROCESS OF MANUFACTURING A SEMICONDUCTOR WAFER INCLUDING HEMISPHERICAL GRAIN POLYSILICON

[75] Inventors: Tyler A. Lowrey; Klaus F. Schuegraf; Randhir P. S. Thakur, all of Boise, Id.

[73] Assignee: Micron Technology, Inc., Boise, Id.

[21] Appl. No.: 593,499

[22] Filed: Jan. 29, 1996

[51] Int. Cl.⁶ .................. H01L 21/66; G01R 31/26
[52] U.S. Cl. .................. 438/14; 438/10; 438/255; 438/398; 324/658
[58] Field of Search .............. 438/255, 14, 10–11, 438/398; 324/658

[56] References Cited

U.S. PATENT DOCUMENTS

| | | | |
|---|---|---|---|
| Re. 32,024 | 11/1985 | Greig | 324/158 |
| 4,409,547 | 10/1983 | Lederman | 324/158 |
| 4,587,484 | 5/1986 | Shulman | 324/158 |
| 5,036,271 | 7/1991 | Mazur et al. | 324/158 |
| 5,140,272 | 8/1992 | Nishimatsu et al. | 324/662 |
| 5,429,966 | 7/1995 | Wu et al. | |

OTHER PUBLICATIONS

Watanabe et al., A new cylindrical capacitor using HSG –Si for 256Mb DRAMs, IEDM 259–262, 1992.
Wolf, Silicon Processing for the VLSI era vol. 2, pp. 595–596, lattice Press 1990.

*Primary Examiner*—Jey Tsai
*Attorney, Agent, or Firm*—Wells, St. John, Roberts, Gregory & Matkin, P.S.

[57] ABSTRACT

A method of monitoring a process of manufacturing a semiconductor wafer including an area of hemispherical grain polysilicon, the method comprising providing a probe including a liquid conductor; and performing a capacitance-voltage measurement with the probe, using a quasi-static measurement method, to determine capacitance-voltage characteristics at the area of hemispherical grain polysilicon.

3 Claims, 4 Drawing Sheets

METHOD OF MONITORING A PROCESS OF MANUFACTURING A SEMICONDUCTOR WAFER INCLUDING HEMISPHERICAL GRAIN POLYSILICON

TECHNICAL FIELD

The invention relates to methods of monitoring the effects of hemispherical grain (HSG) polysilicon film enhancements.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and stacked capacitors, as well as the utilization of new capacitor dielectric materials having higher dielectric constants.

One common material utilized for capacitor plates is conductively doped polysilicon. Such is utilized because of its compatibility with subsequent high temperature processing, good thermal expansion properties with $SiO_2$, and its ability to be conformably deposited over widely varying topography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors used for the deposition.

The prior art has recognized that capacitance of a polysilicon layer can be increased merely by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition under conditions which are intended to inherently induce a rough or rugged upper polysilicon surface. Such include low pressure chemical vapor deposition (LPCVD) techniques. Such techniques are inherently unpredictable or inconsistent in the production of a rugged polysilicon film.

One type of polysilicon film which maximizes a roughened outer surface area is hemispherical grain (HSG) polysilicon typically provided to a thickness of from 300 Angstroms to 400 Angstroms. Such can be deposited or grown by a number of techniques. One technique includes direct LPCVD formation at 590° C. Another includes formation by first depositing an amorphous silicon film at 550° C. using He diluted $SiH_4$ (20%) gas at 1.0 Torr, followed by a subsequent high temperature transformation anneal.

It is desirable to be able to determine parameters of a hemispherical grain polysilicon film enhancement. For example, it is desirable to be able to determine the capacitance that would be produced by a hemispherical grain polysilicon film enhancement.

It is known to measure surface area of a hemispherical grain polysilicon film enhancement using spectral reflectance. Such reflectance methodology gives unreliable measurements.

Scanning Electron Microscopy (SEM) involves creation of a beam of electrons that is accelerated, focused to a small diameter, and directed at a surface of a sample in a raster-scan pattern. The electrons striking the surface cause an emission of electrons and x-rays which are then analyzed. SEM has the capability of providing much higher magnification, resolution, and depth of field than optical microscopy. However, SEM fails to predict the electrical advantages of a hemispherical grain polysilicon film enhancement.

Short loop or in-line production monitors provide more meaningful information, but are slow because many unit process steps stand between electrode formation and electrode measurement.

It is known to determine parameters of a semiconductor material using a mercury probe. See, for example, U.S. Pat. No. 5,140,272 to Nishimatsu, U.S. Pat. No. RE 32,024 to Greig, U.S. Pat. No. 5,036,271 to Mazur, U.S. Pat. No. 4,587,484 to Shulman, or U.S. Pat. No. 4,409,547 to Lederman, all of which are incorporated herein by reference. Mercury probes employ mercury columns as non-invasive contacts for use in measuring electrical properties of semiconductor wafer materials. The mercury columns are contained using vacuum arrangements. After the contact is made, various tests can be performed, such as capacitance-voltage (C-V) tests. The tests that are usually performed using mercury probes are high frequency C-V tests.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention provides a method of monitoring a process of manufacturing a semiconductor wafer including an area of hemispherical grain polysilicon, the method comprising providing a probe including a liquid conductor; and performing a capacitance-voltage measurement with the probe, using a quasi-static measurement method, to determine capacitance-voltage characteristics at the area of the hemispherical grain polysilicon.

In one aspect of the invention, a method of monitoring a process of manufacturing a semiconductor wafer including an area of hemispherical grain polysilicon comprises providing a probe including a liquid conductor; and performing a capacitance-voltage measurement with the probe, using a low frequency measurement method, to determine capacitance-voltage characteristics at the area of hemispherical grain polysilicon.

In another aspect of the invention, a method of manufacturing a semiconductor wafer comprises providing a silicon substrate; depositing a silicon layer on the silicon substrate; forming a hemispherical grain polysilicon area on the silicon layer; forming a dielectric on the hemispherical grain polysilicon area, the dielectric cooperating with the hemispherical grain polysilicon area to define a capacitor; and performing a capacitance-voltage measurement with a mercury probe, using a quasi-static measurement method, to determine the capacitance of the capacitor.

In another aspect of the invention, a method of manufacturing a semiconductor wafer comprises providing a silicon substrate; depositing a silicon layer on the silicon substrate; forming a hemispherical grain polysilicon area on the silicon substrate; forming a dielectric on the hemispherical grain polysilicon area, the dielectric cooperating with the hemispherical grain polysilicon area to define a capacitor; and performing a capacitance-voltage measurement with a mercury probe, using a low frequency measurement method, to determine the capacitance of the capacitor.

In another aspect of the invention, a method of manufacturing a semiconductor wafer comprises forming a hemispherical grain polysilicon area on the silicon substrate; forming a dielectric on the hemispherical grain polysilicon area, the dielectric cooperating with the hemispherical grain polysilicon area to define a capacitor; and performing a capacitance-voltage measurement using a mercury probe in contact with the dielectric, wherein the capacitor is charged by applying a charging voltage to generate a charging current, wherein charging current is integrated with respect to charging time to determine a charge Q, and wherein capacitance is determined as charge Q divided by the charging voltage.

Figure 1:
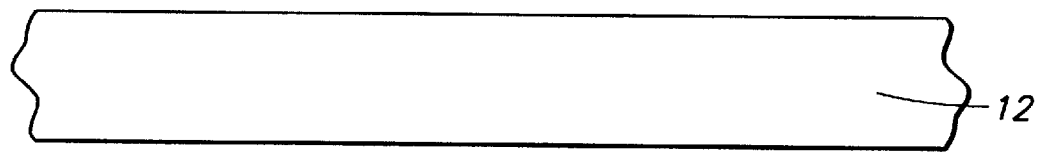
FIG. 1 is a broken away side view of a semiconductor substrate.

The various figures show a method of manufacturing a semiconductor wafer 10. First, a silicon substrate 12 is provided (FIG. 1). The substrate 12 is either a p type or n-type substrate.

Figure 2:
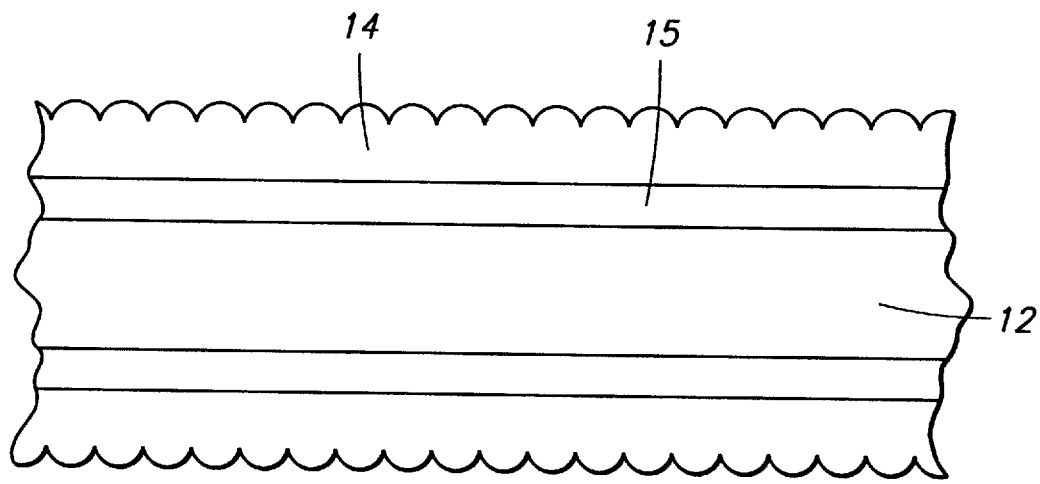
FIG. 2 is a broken away side view of a semiconductor substrate having an area of hemispherical grain polysilicon formed thereon.

Then, a hemispherical grain polysilicon area 14 is formed on the silicon substrate 12 using known techniques, such as the technique described above in the Background of the Invention (FIG. 2). For example, a hemispherical grain polysilicon film can be deposited on the silicon substrate 12. In one embodiment, a polysilicon underlay 15 is formed on the substrate 12, and the hemispherical grain polysilicon area 14 is formed on the polysilicon 15.

Figure 3:
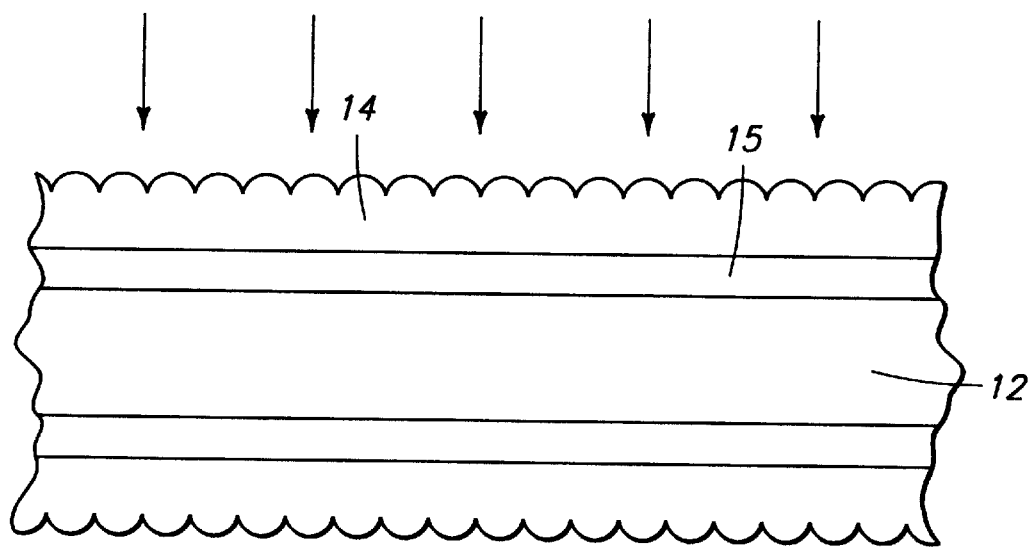
FIG. 3 illustrates an implantation into the hemispherical grain polysilicon.
Figure 4:
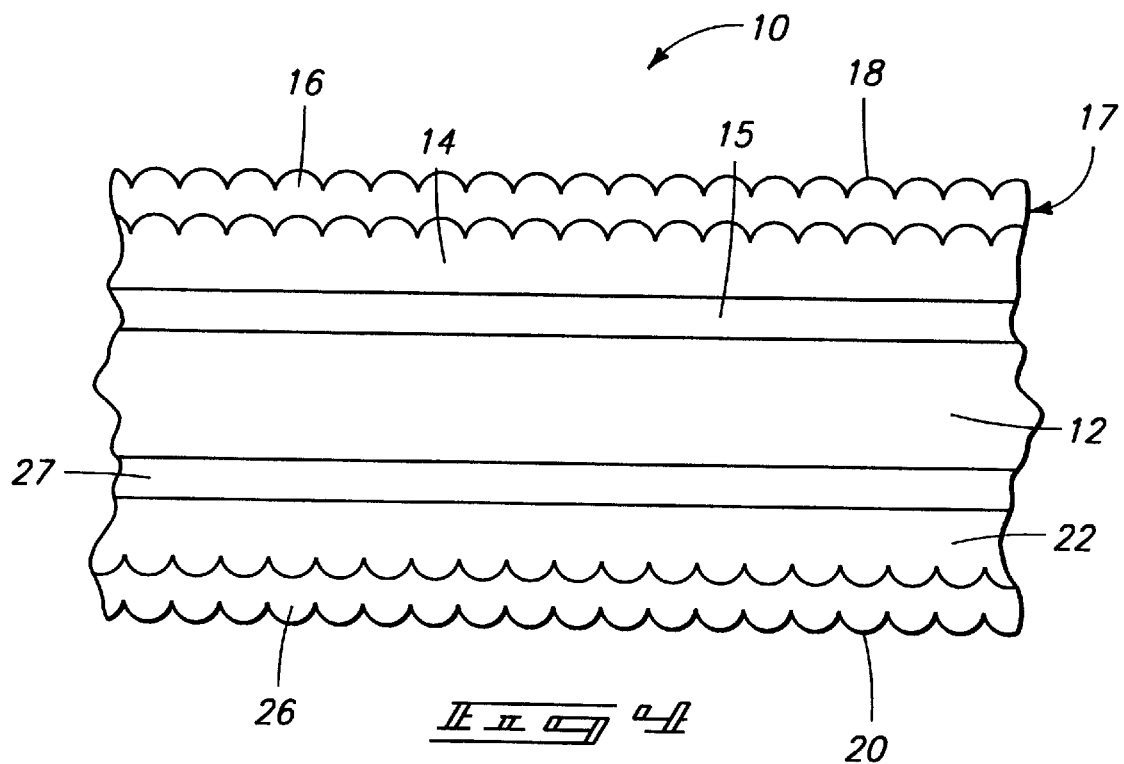
FIG. 4 illustrates forming a dielectric on the hemispherical grain polysilicon to complete a semiconductor wafer.

In one embodiment, after the hemispherical grain polysilicon area is formed on the silicon substrate 12, an implantation is performed (FIG. 3). The implantation is to dope the hemispherical grain polysilicon area 14 to make a conductive contact. This implantation step may be omitted if polysilicon underlay 15 is provided and polysilicon underlay 15 is heavily doped.

Then, a dielectric 16 is formed on the hemispherical grain polysilicon area 14 (either by deposition or by growth). The dielectric 16 can be a multi-layer or a single layer film (e.g., Rapid Thermal oxide or nitride, Rapid Thermal CVD oxide or nitride, deposited nitride with or without reoxidation anneal, etc.). The dielectric 16 cooperates with the hemispherical grain polysilicon area 14 to define (complete) a capacitor 17 which can be tested.

After being prepared for testing, the wafer 10 has a front side 18 which has the area 14 of hemispherical grain polysilicon. The wafer 10 also has a back side 20, on the opposite side of the substrate 12. The back side 20 has a hemispherical grain polysilicon area 22 and a dielectric 26 formed over the hemispherical grain polysilicon 22. In one embodiment, the back side 20 further has a polysilicon underlay 27 between the substrate 12 and the hemispherical grain polysilicon 22. The area 22 on the back side 20 is opposite the area 14 on the front side 18.

Figure 8:
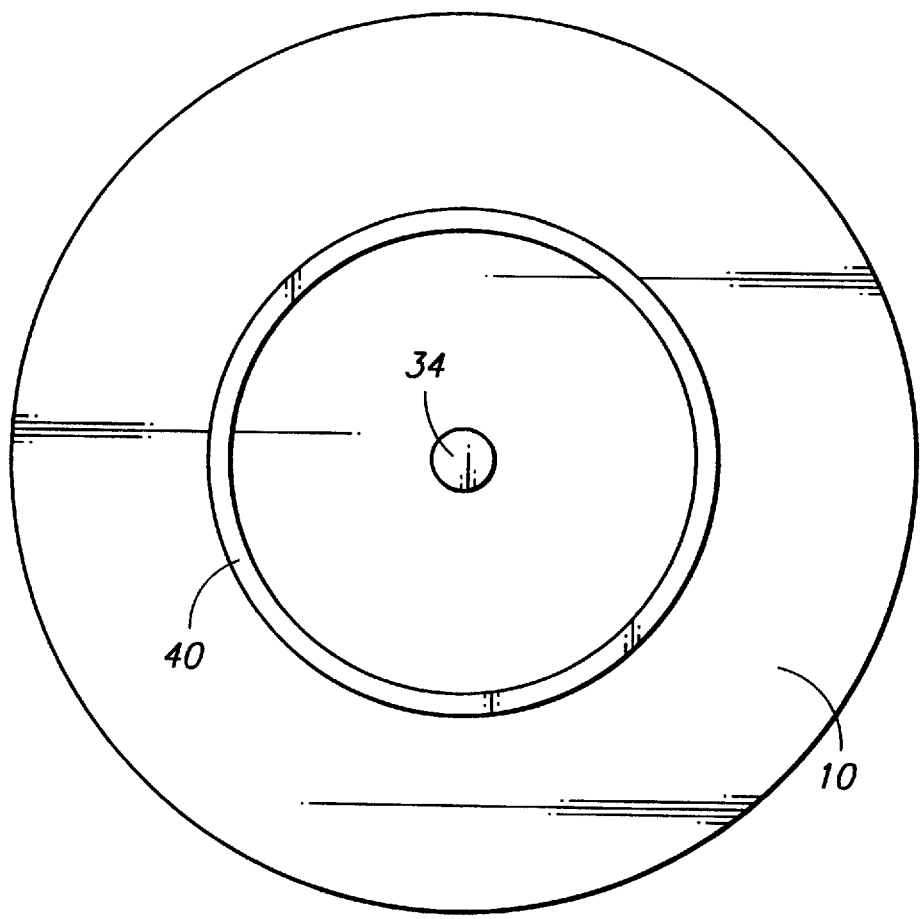
FIG. 8 is a top view of a semiconductor wafer illustrating contact locations where the probe contacts the semiconductor wafer according to the embodiment shown in FIG. 7.

Then, a capacitance-voltage measurement is performed with a probe 28 having a liquid conductor 30. In the illustrated embodiment, the probe 28 is a MDC mercury probe, sold by Materials Development Corporation, 21541 Nordhoff Street, Chatsworth, Calif. 91311. The MDC mercury probe is capable of various operating modes, such as front-back contact, and dual front contact. More particularly, the mercury probe 28 includes a mercury tip 32 adapted to contact a location 34 on the front side of the wafer 10, a conductive chuck 36 adapted to contact the back side 20 of the wafer 10 to support the wafer 10, and provide for front-back contact. The mercury probe 28 further includes a conductive ring 38 adapted to contact a location 40 surrounding the location 34 where the mercury tip 32 contacts the wafer 10, for dual front contact (FIG. 8).

The capacitance-voltage measurement is taken by providing a providing a capacitance-voltage meter 42 and connecting the capacitance-voltage meter 42 to the mercury probe 28.

Figure 5:
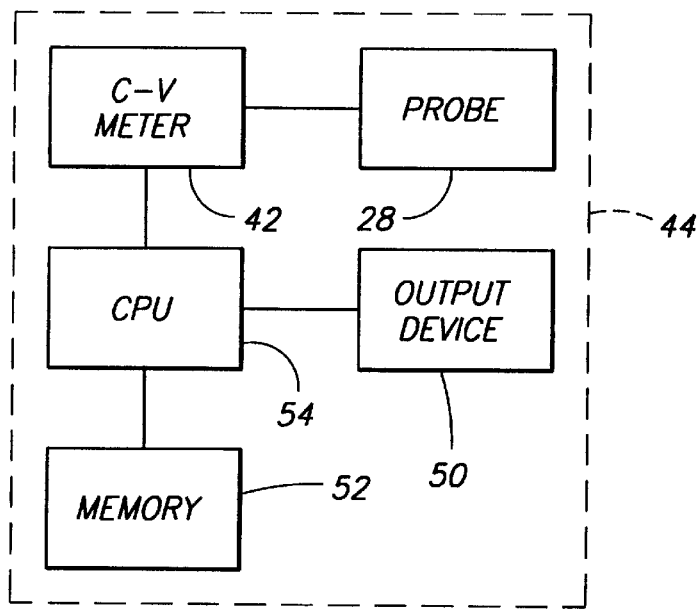
FIG. 5 is a block diagram of a plotting system used to test the semiconductor wafer of FIG. 4.

More particularly, in the illustrated embodiment, a plotting system 44 is provided which comprises both the capacitance-voltage meter 42 and the mercury probe 28 (FIG. 5). More particularly, in the illustrated embodiment, the plotting system 44 is a MDC CSM/2 C-V plotting system sold by Materials Development Corporation, 21541 Nordhoff Street, Chatsworth, Calif. 91311. Such C-V plotting systems 44 can be customized by selecting capacitance-voltage meters, output devices, and probe stations.

In one embodiment, the plotting system 44 is customized with the above mentioned MDC mercury probe 28, and with a capacitance-voltage meter 42 that performs measurements using a quasi-static measurement method. Quasi-static measurement methods are known in the art and are discussed in various references listed above in the Background of the Invention. In one embodiment, the quasi-static measurement method involves applying a linear voltage ramp to the capacitor to generate a charging current. The charging current is divided by the constant voltage, according to the well-known law C=I/(dv/dt), or capacitance equals current divided by rate, to determine the capacitance C. Various ramp slopes can be employed. For example, the slope of the ramp can be varied based on the area of the tip 32 of the probe 28. If the area of the tip 32 is increased, a larger current is measured, and the ramp rate is preferably increased. For example, in one embodiment, the probe 28 has a tip 32 of 0.0135 square centimeters, and the quasi-static measurement method employed comprises applying a linear ramp having a ramp rate of 0.1 Volts per second.

In another embodiment of quasi-static measurement, a pulse technique is employed. A small signal or pulse is sent to the capacitor, and all frequencies that are odd harmonics of the pulse that can respond do respond.

In an alternative embodiment, the C-V plotting system is customized with the above mentioned MDC mercury probe, and with a capacitance-voltage meter 42 that performs measurements using a low frequency measurement method. Low frequency measurement methods are known in the art and are discussed in various references listed above in the Background of the Invention. The inventors have determined that frequencies at or above 10 kHz will not give valid results, and that frequencies at or below 1 Hz will give valid results. In one embodiment, the low frequency employed is below 4000 Hz. In a more particular embodiment, the low frequency employed is below 100 Hz. In a more particular, embodiment, the low frequency employed is below 10 Hz.

The inventors have discovered that because of the large number of interface traps and high resistance at areas of silicon wafers including hemispherical grain polysilicon, capacitance measurements using a high frequency measurement method does not produce valid results. The inventors have also discovered that valid measurements can be obtained if either the low frequency measurement method or a quasi-static measurement method is employed, so that interface traps are given time to respond.

Capacitance-voltage meters 42 that can be used to perform measurements using the quasi-static measurement method and capacitance meters that can be used to perform measurements using the low frequency method are sold by Hewlett-Packard, Keithley, and Boonton.

The capacitance-voltage meter 42 has two electrodes or terminals for connection to a probe: a force electrode or terminal 46, and a sense electrode or terminal 48. These electrodes 46 and 48 are connected to a probe station which acts on a semiconductor wafer to obtain electrical measurements. One of the electrodes 46 and 48 is connected to an area that is much larger (e.g., 10 to 100 times larger, or more) than the area of the mercury tip 32 that faces the semiconductor wafer. For example, it is desirable to make the back side capacitance much larger that the front side capacitance so that the back side capacitance is not a meaningful variable and does not affect measurements.

Figure 6:
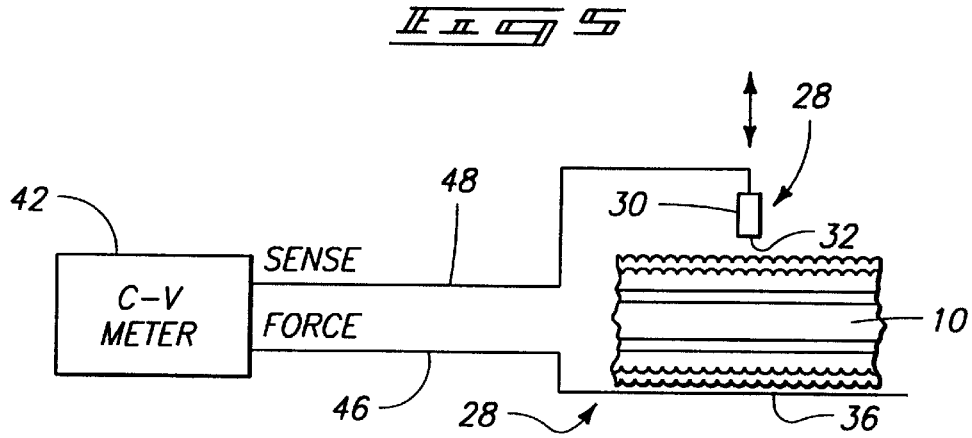
FIG. 6 illustrates a C-V meter and a probe operating on the semiconductor wafer of FIG. 4, according to one embodiment of the invention.

Various operating modes of the probe 28 are possible. In one embodiment, the sense electrode 48 of the capacitance-voltage meter 42 is connected to the tip 32 of the mercury probe, and the force electrode 46 of the capacitance-voltage meter is connected to the chuck 36 (FIG. 6). The semiconductor wafer 10 is supported on the conductive chuck 36 with dielectric 26 on the back side 20 of the semiconductor wafer 10 on the conductive chuck, and the mercury tip 32 is caused to contact the dielectric 16 on the front side 18. The capacitance-voltage meter 42 is then operated so that a capacitance-voltage measurement is taken using either the low frequency measurement method, or the quasi-static measurement method.

Figure 7:
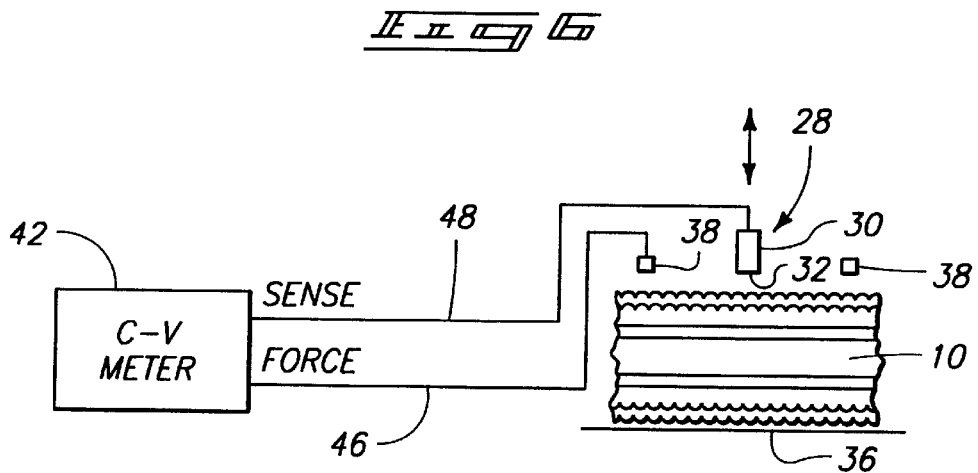
FIG. 7 illustrates a C-V meter and a probe operating on the semiconductor wafer of FIG. 4, according to another embodiment of the invention.

In another embodiment, the sense electrode 48 of the capacitance-voltage meter is connected to the tip 32 of the mercury probe 28, and the force electrode 46 of the capacitance-voltage meter 42 is connected to the conductive annular ring 38 (FIG. 7). The mercury tip 32 is caused to contact the dielectric 16 at the first location 34, and the conductive annular ring is caused to contact the dielectric 16 at the second location 40 (FIG. 8). The capacitance-voltage meter 42 is then operated so that a capacitance-voltage measurement is taken using either the low frequency measurement method, or the quasi-static measurement method.

The C-V plotting system further includes computer components such as an output device 50, memory 52 (random access memory, read only memory, a hard disk drive, a floppy disk drive, and/or other memory components found in a computer system), and a processor or CPU 54. The processor 54 is in communication with the memory 52, with the capacitance-voltage meter 42, and with the output device 50.

Any desired output device 50 or devices can be employed in the C-V plotting system to report, store, graph or transfer the measurement data. For example, dot matrix or inkjet printers can be employed to list and graph data. Other output devices that can be employed included digital plotters, paperless output devices, network devices, etc.

After the capacitance of the area including the hemispherical grain polysilicon has been determined, other information such as surface area (or increase in surface area provided by employing hemispherical grain polysilicon) can be derived, if desired.

The invention provides a method for more quickly determine capacitance. In a conventional production flow, HSG is deposited, patterned, etched, and doped, nitride is deposited and reoxidized, and a counter electrode (polysilicon) is deposited, patterned, doped and annealed. The resulting product can then be measured for capacitance. This process takes at least several days to complete, and typically takes up to two weeks. Thus, it takes a long time to determine capacitance in the conventional production flow.

Using one embodiment of the invention, HSG is deposited (perhaps on a test wafer), optionally implanted, nitride is deposited and reoxidized, and capacitance is measured using a mercury probe. This process has a latency measured in hours, rather than days, making it much more immediate and efficient.

Thus, a method of determining capacitance of a semiconductor wafer including an area of hemispherical grain polysilicon, in a production environment, has been provided.

While the invention has been described above as involving a test wafer having a capacitor thereon, the invention steps of providing a probe and performing a capacitance-voltage measurement with the probe using quasi-static or low frequency measurement methods can also be performed to determine the capacitance of complicated completed topographies, in an alternative embodiment. Examples of complicated topographies include stacked or trench capacitors including hemispherical grain polysilicon. Stacked capacitor structures including hemispherical grain polysilicon electrodes are disclosed in an article titled "*A New Stacked Capacitor Structure Using Hemispherical-Grain (HSG) Poly-Silicon-Electrodes*" by H. Watanabe et al., Extended Abstracts of the 22nd Conference on Solid State Devices and Materials, Sendai, 1990, pp. 873–876. Stacked capacitors in general are discussed in U.S. Pat. No. 5,061,650 to Dennison et al. (incorporated by reference).

More particularly, in this alternative embodiment, the probe 28 and capacitance-voltage meter 42 can be used with a completed wafer having a complex topography thereon. The capacitance-voltage meter 42 is operated so that a capacitance-voltage measurement is taken using either the low frequency measurement method, or the quasi-static measurement method, as previously described.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of manufacturing a semiconductor wafer, the method comprising:

provideing a silicon substrate having a front side and a back side;

depositing a silicon layer on front side and the back side of the silicon substrate;

forming a hemispherical grain polysilicon area on the silicon layer on the front side, and forming a hemispherical grain polysilicon area on the silicon layer on the back side;

performing an implantation to dope the hemispherical grain polysilicon area on the front side to make a conductive contact;

forming a dielectric on the hemispherical grain polysilicon area on the front side, the dielectric cooperating with the hemispherical grain polysilicon area to define a capacitor, and forming a dielectric on the hemispherical grain polysilicon area on the back side; and determining surface area of the hemispherical grain polysilicon area, the determining comprising performing a capacitance-voltage measurement with a mercury probe having a mercury tip in selective contact with the dielectric and a conductive chuck selectively supporting the wafer, using a quasi-static measurement method, to determine the capacitance of the capacitor, wherein performing a capacitance-voltage measurement comprises the step of providing a capacitance-voltage meter having a first electrode connected to the tip of the mercury probe, and having a second electrode connected to the chuck, and the step of supporting the dielectric on the back side of the semiconductor wafer on the conductive chuck and causing the mercury tip to contact the dielectric on the front side of the semiconductor wafer.

2. A method in accordance with claim 1 wherein the step of forming a dielectric comprises depositing a dielectric on the hemispherical grain polysilicon.

3. A method in accordance with claim 1 wherein the step of forming a dielectric comprises growing a dielectric on the hemispherical grain polysilicon.

* * * * *